(12) United States Patent
Ma et al.

(10) Patent No.: US 7,859,803 B2
(45) Date of Patent: Dec. 28, 2010

(54) VOLTAGE OVERLOAD PROTECTION CIRCUITS

(75) Inventors: Yintat Ma, Diamond Bar, CA (US); Guann-Pyng Li, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/533,328

(22) Filed: Sep. 19, 2006

(65) Prior Publication Data

US 2007/0070563 A1    Mar. 29, 2007

Related U.S. Application Data

(60) Provisional application No. 60/718,965, filed on Sep. 19, 2005, provisional application No. 60/718,967, filed on Sep. 19, 2005, provisional application No. 60/718,966, filed on Sep. 19, 2005.

(51) Int. Cl.
    *H02H 9/00* (2006.01)
(52) U.S. Cl. .................... 361/56; 361/91.1; 361/111
(58) Field of Classification Search ............ 361/56, 361/91.1, 111
    See application file for complete search history.

(56) References Cited

U.S. PATENT DOCUMENTS

| | | | |
|---|---|---|---|
| 3,755,751 A | 8/1973 | Ring | |
| 4,866,401 A | 9/1989 | Terasima | |
| 5,028,977 A | 7/1991 | Kenneth et al. | |
| 5,550,699 A | 8/1996 | Diaz | |
| 5,708,549 A | 1/1998 | Croft | |
| 5,774,318 A * | 6/1998 | McClure et al. | 361/56 |
| 5,945,713 A | 8/1999 | Voldman | |
| 6,069,782 A | 5/2000 | Lien et al. | |
| 6,459,340 B1 | 10/2002 | Apel et al. | |
| 6,529,059 B1 | 3/2003 | Davis | |
| 6,600,356 B1 | 7/2003 | Weiss | |

(Continued)

FOREIGN PATENT DOCUMENTS

WO    WO 03/063203 A2    7/2003

OTHER PUBLICATIONS

Ma et al., "*InGaP/GaAs HBT RF Power Amplifier with Compact ESD Protection Circuit*", IEEE MTT-S Digest (2004), pp. 1173-1176.

(Continued)

*Primary Examiner*—Jared J Fureman
*Assistant Examiner*—Christopher J Clark
(74) *Attorney, Agent, or Firm*—Orrick, Herrington & Sutcliffe LLP

(57) ABSTRACT

Improved protection circuits are provided for use as voltage overload protection circuits, ESD protection circuits for RF input pins, and unit protection cells for distributed amplifiers. Preferably, the protection circuits include a positive threshold voltage trigger used to trigger a switch wherein the trigger includes a diode string in series with a resistor and the switch includes a bipolar transistor switch in series with a diode. Alternatively, the trigger includes a diode string in series with a single diode and a single resistor, and is used to trigger a Darlington pair transistor switch in series with a diode. In another embodiment, a Darlington pair transistor switch is triggered by a capacitor. In use with distributed amplifiers, the ESD protection circuits are preferably absorbed inside the artificial transmission lines of the distributed amplifier.

18 Claims, 8 Drawing Sheets

U.S. PATENT DOCUMENTS

| | | | |
|---|---|---|---|
| 6,624,999 | B1 | 9/2003 | Johnson |
| 6,724,603 | B2 | 4/2004 | Miller et al. |
| 7,154,339 | B2 * | 12/2006 | Kramer et al. ............... 330/295 |
| 7,280,332 | B2 | 10/2007 | Ma et al. |
| 7,589,944 | B2 | 9/2009 | Mergens |
| 2001/0015881 | A1 | 8/2001 | Takikawa et al. |
| 2002/0130392 | A1 | 9/2002 | Brennan et al. |
| 2002/0154463 | A1 * | 10/2002 | Mergens et al. ............... 361/56 |
| 2003/0231441 | A1 | 12/2003 | Testin |
| 2004/0212936 | A1 | 10/2004 | Salling et al. |
| 2004/0239437 | A1 * | 12/2004 | Hosoya .................... 333/22 R |
| 2006/0044719 | A1 * | 3/2006 | Chen et al. .................... 361/56 |
| 2006/0238269 | A1 | 10/2006 | Hosoya |
| 2007/0058308 | A1 | 3/2007 | Thijs |
| 2007/0070564 | A1 | 3/2007 | Ma et al. |

OTHER PUBLICATIONS

Ma et al., "*A novel on-chip ESD protection circuit for GaAs HBT RF power amplifiers*", Journal of Electrostatics 59 (2003), pp. 211-227.

Ma et al., "*A novel on-chip ESD protection circuit for GaAs HBT RF power amplifiers*", 2002 Electrical Overstress/Electrostatic Discharge Symposium Proceedings (2002), pp. 83-91.

Ma et al., "*ESD Protection Design Considerations for InGaP/GaAs HBT RF Power Amplifiers*", IEEE Transactions on Microwave Theory and Techniques, vol. 53, No. 1 (Jan. 2005), pp. 221-2005.

Ma et al., "*In GaP/GaAs HBT RF Power Amplifier with Compact ESD Protection Circuits*", 2004 Electrical Overstress/Electrostatic Discharge Symposium Proceedings (2004), pp. 50-56.

Ma et al., "*In GaP/GaAs HBT DC-20 GHz distributed amplifier with ESD Protection Circuits*", Journal of Electrostatics 64 (2006), pp. 88-95.

EP, Supplementary European Report, EP 06 81 4981, Apr. 19, 2010.

* cited by examiner

VOLTAGE OVERLOAD PROTECTION CIRCUITS

CROSS-REFERENCE TO RELATED APPLICATIONS

This application claims the benefit of U.S. Provisional Application No. 60/718,965 filed Sep. 19, 2005, U.S. Provisional Application No. 60/718,967, filed Sep. 19, 2005, and U.S. Provisional Application No. 60/718,966 filed Sep. 19, 2005, which applications are incorporated herein by reference.

FIELD OF THE INVENTION

The present disclosure relates to low capacitance loading electrostatic discharge (ESD) protection circuits and, more particularly, to ESD protection circuits for use as on-chip voltage overload protection circuits for power amplifiers.

BACKGROUND

The collector output of an RF power amplifier is usually connected with a RF inductor, often referred to as the RF choke, and an output impedance matching network. The other side of the output impedance matching network is terminated with a termination, such as an antenna. The voltage at the transistor collector output is described by $$Vo + Vs + L\frac{di}{dt}.$$

As a result, the voltage at the transistor collector output can be higher than the supply voltage. Furthermore, how high this voltage would be also depends on the impedance of the output impedance matching network. In an output impedance mismatch condition, such as in cases of a loose or obstructed antenna, the reflected signal reflects back to the transistor and produces a large voltage waveform so severe that the transistor junctions can be damaged. Furthermore, the power amplifier, due to the requirement of delivering high output power with high efficiency, often operates at an overdrive condition in which the transistor input voltage is so high that it switches on and off the collector current.

During overdrive, the transistor can be modeled as a switch S in parallel with a capacitor C as shown in FIG. 1. When the switch S is shorted, the current through the inductor is at a maximum. As soon as the switch S is opened, since the inductor current cannot be zero instantaneously, the inductor current flows to the transistor capacitance and the output impedance network. Because of an enormous inductor current, the transient voltage at the collector output can be very high. This excessive voltage overload can lead to device failure and degradation in reliability if it is higher than the breakdown voltages.

Even when the output termination impedance is 50 ohm, the transient collector output voltage waveform during RF overdrive can be larger than the breakdown voltage as shown in FIG. 2a. Since the excess voltage as shown is positive, the C-E and C-B junction are vulnerable. Output impedance mismatch and modulated input signal combined with overdrive can make the voltage overload more severe. For an open termination, such as the case when an antenna is not connected, combined with RF overdrive, the output voltage is the most severe as shown in FIG. 2b. The transient output voltage is so large that it even goes negative in which case the E-B junction is also vulnerable. For a shorted termination combined with RF overdrive, although the voltage overload is not as severe as the open termination, it is still more severe, as shown in FIG. 2c, than a 50 ohm case. Modulation of the input signal can add additional transient output voltage. With just a simple AM modulation with a pulse train combined with RF overdrive, the voltage overload gets even worse as shown in FIG. 2d. For a multiple stage amplifier, the voltage overload at the output stage can be even worse if the driver stages are overdriven, since the voltage spikes of the driver stages would be amplified by the output stages. Usually, the transistor failures due to voltage overload occurs at the output stage, but they can also occur at the driver stages.

The function of a voltage overload protection circuit is to clamp the excess voltage to a safe level and bypass the overload current away from the transistor. This voltage clamp design should take into consideration the voltage swing of the signal so the operation of the power amplifier is not interfered. The voltage overload protection circuit should have low loading capacitance, so the RF performance is not affected.

An ESD protection circuit shown in FIG. 3, which can be used as a voltage overload protection circuit, is designed as a VDD to VSS clamp circuit for CMOS. [Ker, 2001.] To avoid the diode leakage problem associated with un-isolated diodes, the diode is selected doped on a field oxide. This design uses a diode string (D1) to trigger the NMOS (Mn3). The voltage across R3 turns on Mn3.

An ESD protection circuit using a diode string shown in FIG. 4, which can be used as a voltage overload protection circuit, is popular in GaAs HBT design and is commonly used. Because diodes on GaAs are made with epi layers either of MOVCD or MBE, they do not have current leakage problem associated with implanted diodes for Silicon.

When a positive voltage is applied to a PAD (FIG. 4), the diode string (D2) is turned on. The overload current then sinks through the string of diodes. The number of diodes determines the preset voltage that turns on the diodes. When a negative voltage is applied to the PAD, the reverse diode (D3) turns on and sinks the overload current. Because of the series resistance of the diodes, the required area of the diodes is huge. This, in turn, increases the diode capacitance, which can limit the frequency bandwidth.

In the case of SiGe, the implanted diode string without isolation, shown in FIG. 5, is actually a set of bipolar transistors (BPT1) in series as shown in FIG. 6. As the temperature increases, the leakage current from the collector to substrate increases. Because of this current leakage, the latter stages have lower current density due to current flow to ground. This results in declining incremental voltage drop across the diode string. Therefore, the diode should be isolated.

ESD protection of an RF input pin of integrated circuits, such as a telecom integrated, circuit can be difficult. The operation voltage at the RF input pin is low, so the turn on voltage of the ESD protection circuit must be low. Even so, for the RF input pin ESD protection, the base-emitter junction at the RF signal input must turn on first during the ESD event before the ESD protection circuit. The ESD protection circuit can only turn on when the base voltage becomes sufficiently high which is permitted thanks to a base-emitter resistance drop. Because of this inherent problem, the base-emitter always has to endure some amount of ESD stress before the protection circuit turns on. For this reason, ESD voltage protection for the RF input pin is more difficult.

Furthermore, the input ESD protection circuit needs to limit excessive forward base-emitter current during ESD stress. Using a 2-diode string ESD protection circuit would work without introducing a significant resistance voltage drop problem associated with the large number of series diodes in diode strings typically used at the RF output and DC pin. Simulation also shows that a 2-diode string would have low capacitance and low turn on resistance. However, since a two-diode string has a low turn on voltage due to a lower number of diodes, its leakage current is greater if the input voltage swing is large. A 2-diode string, due to its low turn on voltage, has a significant leakage current when the input RF power is more than 10 dBm and worse linearity (2 tone 3rd order inter-modulation products).

Distributed amplifiers have very wide bandwidths due to their transmission line characteristics. However, when ESD protection circuits are added to a distributed amplifier, the capacitance loading of the ESD protection circuits can degrade the bandwidth of the distributed amplifier.

There is therefore a need for an improved ESD protection circuit for use as an overload protection circuit for power amplifiers, an ESD protection circuit for RF input pins for integrated circuits such as telecom circuits, and unit protection cells for a distributed amplifier.

SUMMARY

The embodiments disclosed herein provide ESD protection circuits for use as on-chip voltage overload protection circuits for power amplifiers, on-chip ESD protection circuits for RF input pins for integrated circuits such as telecom integrated circuits, and unit protection cells for integration with artificial transmission lines of distributed amplifiers. In one embodiment, an overload protection circuit includes a positive threshold voltage trigger used to trigger a switch. The positive threshold voltage trigger preferably comprises a diode string in series with a single resistor. The switch preferably comprises a bipolar transistor switch in series with a single reverse diode.

In another embodiment, the positive threshold voltage trigger comprises a diode string in series with a single diode and a single resistor. The voltage trigger is used to trigger a Darlington pair transistor switch in series with a single reverse diode. The Darlington pair transistor switch comprises a first transistor in series with a second transistor. For the same circuit providing both ESD and voltage overload protection, the number of diodes can be carefully selected to determine the appropriate turn on voltage and the overload voltage level that can be protected. In each embodiment, the reverse diode can be used for clamping excess negative overload voltage.

During a voltage overload event, the excess voltage is coupled across the diode string of the trigger and turns on the switch. The voltage overload protection circuit is very fast and preferably faster than the power amplifier. Preferably, the voltage trigger is turned on in less than 20 psec. In a preferred embodiment, the diode is an isolated implanted diode.

The overload protection circuit preferably has less parasitic capacitance than a conventional diode string approach for an overload protection circuit. From simulation, conventional circuits have been shown to have twice the parasitic capacitance as the overload protection circuit provided herein with similar overload protection performance. Further, the overload protection circuit of the present invention occupies one forth of the area and has one half the capacitance of a conventional diode string approach for an ESD protection circuit. The smaller size is due to the Darlington pair being more efficient for conducting excess current. Because of less capacitance, the overload protection circuit provided herein can enhance the circuit performance of the main circuit at higher frequency.

In an embodiment of an ESD protection circuit for use as an on-chip ESD protection circuit of RF input pins for integrated circuits such as telecom integrated circuits. The ESD protection circuit preferably includes a Darlington transistor switch triggered by a capacitor. In a preferred embodiment, the Darlington transistor switch preferably has 2 or 3 transistors.

During an ESD event, ESD is coupled across the capacitor and turns on the Darlington switch. Since the Darlington switch has high current gain, only a small amount of input ESD current is needed to trigger the Darlington switch, thus resulting in a small size for the trigger capacitor. The trigger capacitor also has the benefit of blocking the DC current, reducing the leakage current at high power, improving linearly and lowering the overall capacitance loading.

The embodiments disclosed herein provide a improved ESD protection circuit for distributed amplifiers wherein the ESD protection circuits are absorbed inside the artificial transmission lines of the distributed amplifier. In this scheme, since ESD protection circuits are distributed in every transistor stage, the capacitance of the ESD protection circuit is absorbed and becomes part of the capacitance used for forming the artificial transmission lines. Since there are more ESD protection circuits, the size of each current switch (Darlington pair) can be reduced in size to obtain lower capacitance.

The ESD protection circuits can be diode or capacitor triggered.

Further, objects and advantages of the invention will become apparent from the following detailed description and accompanying drawings.

BRIEF DESCRIPTION OF THE FIGURES

The details of the invention, including fabrication, structure and operation, may be gleaned in part by study of the accompanying figures, in which like reference numerals refer to like segments.

Figure 1:
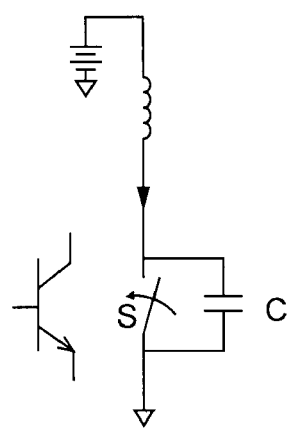
FIG. 1 is a schematic of a transistor modeled as a switch for RF overdrive.
Figure 2A:
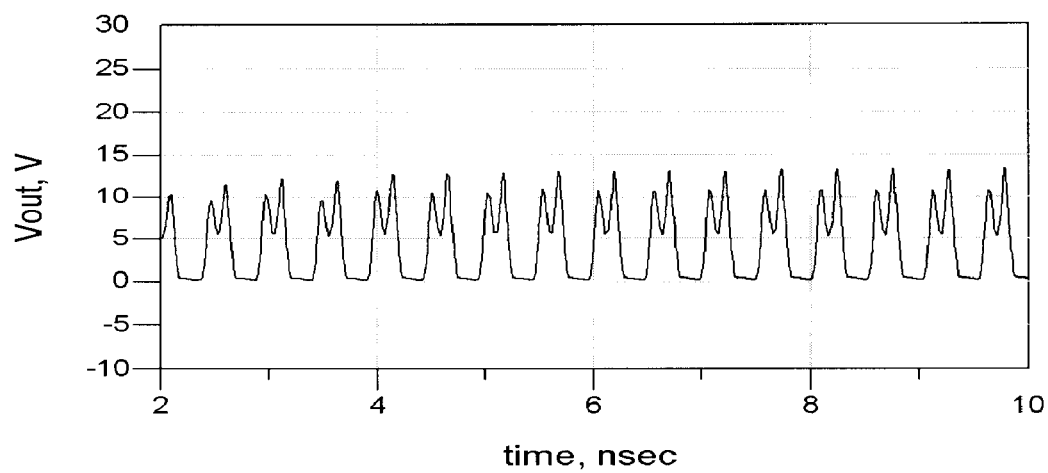
FIG. 2 is a graphical representation of a simulated voltage waveform at the collector output for a WCDMA power amplifier during RF overdrive when output termination is (a) 50 ohm, (b) open, (c) short, and (d) 50 ohm and the input signal is AM modulated with pulses.
Figure 2B:
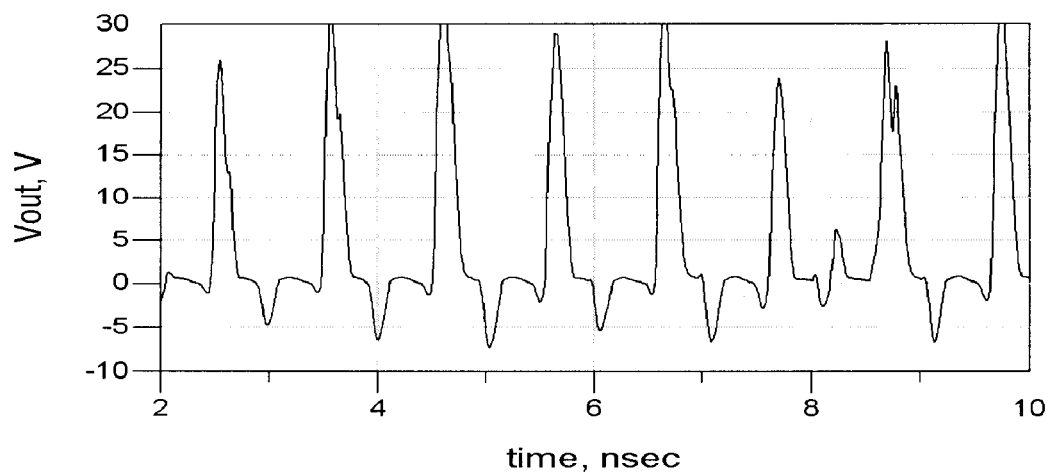
Figure 2C:
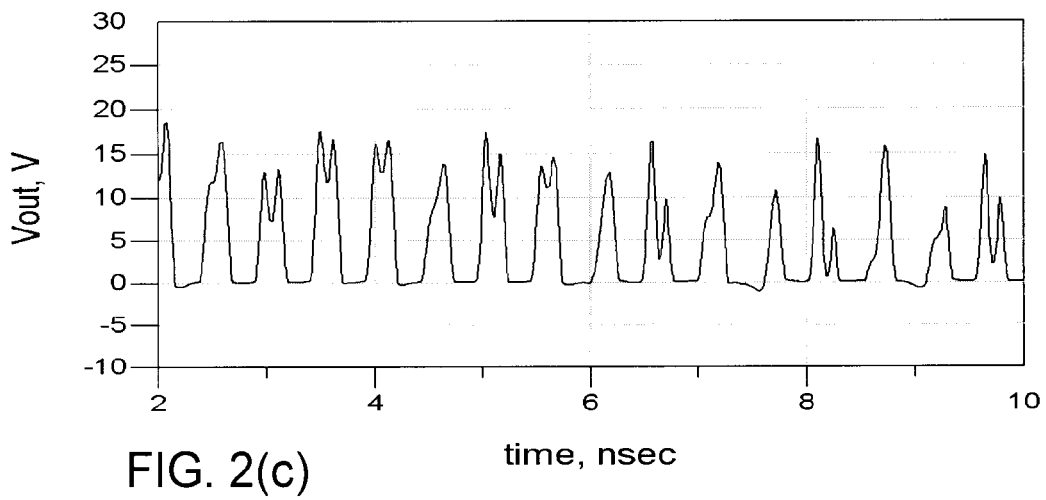
Figure 2D:
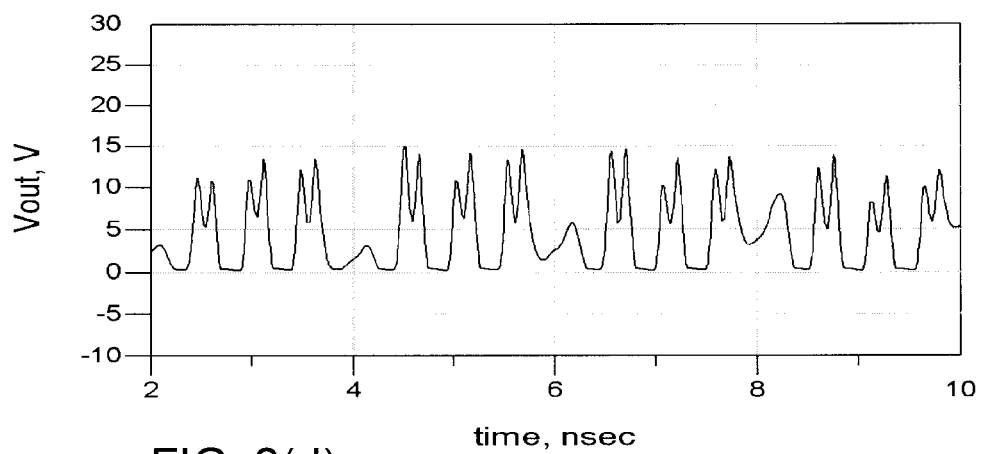

It should be noted that the figures are not drawn to scale and that elements of similar structures or functions are generally represented by like reference numerals for illustrative purposes throughout the figures. It also should be noted that the figures are only intended to facilitate the description of the preferred embodiments.

DETAILED DESCRIPTION

Each of the additional features and teachings disclosed below may be utilized separately or in conjunction with other features and teachings to provide ESD protection circuits for use as on-chip voltage overload protection circuits for power amplifiers, on-chip ESD protection circuits for RF input pins for integrated circuits such as telecom integrated circuits, and unit protection cells for integration with artificial transmission lines of distributed amplifiers. Representative examples of the present invention, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

The embodiments disclosed herein provide low loading capacitance on-chip ESD protection circuits for use as voltage overload protection circuits for power amplifiers at output impedance mismatch, RF overdrive, and modulated input signal conditions, as ESD protection circuits for RF input pins of integrated circuits such as telecom integrated circuits, unit protection cells to be integrated with artificial transmission lines for broadband amplifiers such as distributed amplifiers without degrading their performance. A low loading capacitance on-chip ESD protection circuit for telecom integrated circuits implemented by heterojunction bipolar transistor technology is described in U.S. Pat. No. 7,280,332 issued on Oct. 9, 2007, filed on Jan. 18, 2002, which is incorporated herein by reference.

Figure 7:
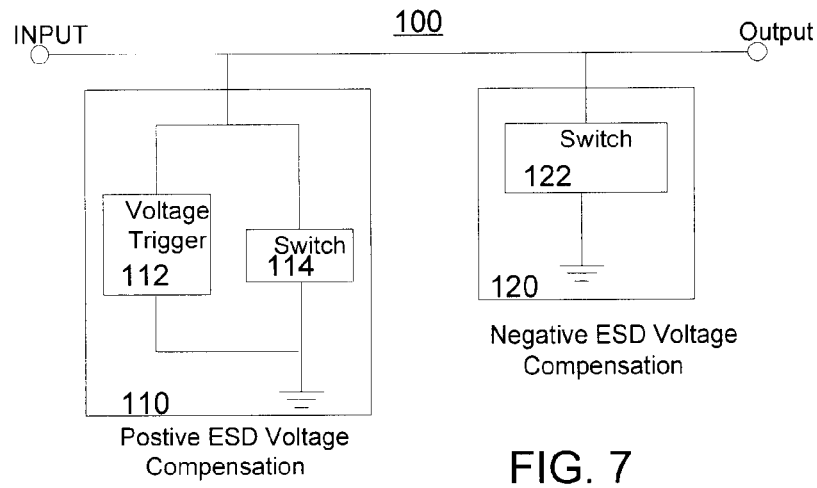
FIG. 7 is a schematic block diagram of a voltage overload protection circuit.
Figure 8:
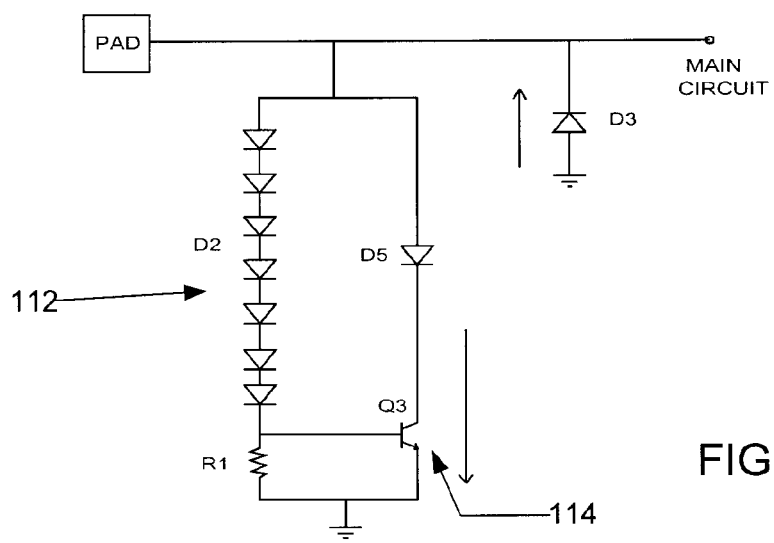
FIG. 8 is a schematic of an on-chip voltage overload protection circuit using single bipolar transistor switch.
Figure 9:
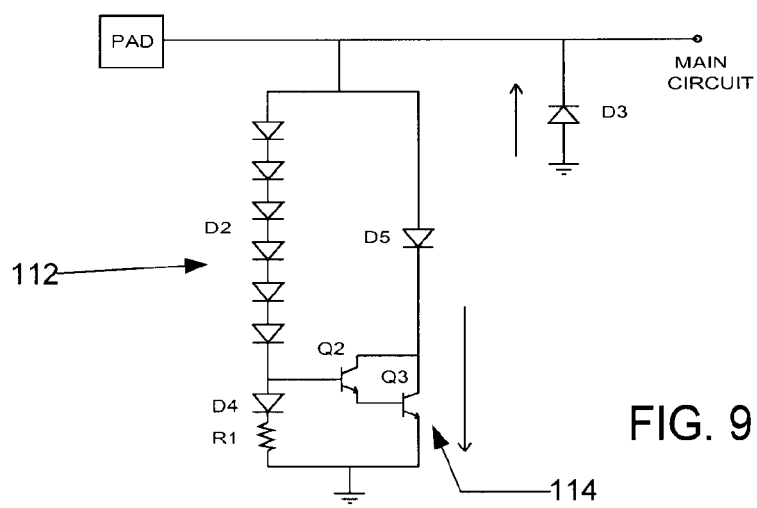
FIG. 9 is a schematic of an on-chip voltage overload protection circuit using Darlington pair switch.

Preferred embodiments of the overload protection circuits are depicted schematically in FIGS. 7, 8 and FIG. 9. Turning to FIG. 7, as depicted, an overload protection circuit 100 preferably includes positive and negative overload voltage compensation blocks 110 and 120 respectively. The positive compensation block 110 preferably includes a voltage trigger 112 and a switch 114. The negative compensation block 120 preferably includes a switch 122.

Referring to FIG. 8, the overload protection circuit includes a positive threshold voltage trigger 112, which preferably comprises a diode string D2 in series with a single resistor R1. The trigger 112, which is coupled to a switch 114, is used to trigger the switch 114. As depicted, the switch 114 is preferably a bipolar transistor switch Q3 in series with a single diode D5.

Referring to FIG. 9, the positive threshold voltage trigger 112 preferably comprises a diode string D2 in series with a single diode D4 and a single resistor R1. The voltage trigger 112 is preferably coupled to and used to trigger a Darlington pair transistor switch 114 in series with a single diode D5. The Darlington pair transistor switch 114 preferably comprises a first transistor Q2 in series with a second transistor Q3. Where the same circuit provides both ESD and voltage overload protection, the number of diodes can be carefully selected to determine the appropriate turn on voltage and the level of overload voltage that can be protocted.

The reverse diode D3, shown in both FIG. 8 and FIG. 9, can be used for clamping excess negative overload voltage.

Figure 10:
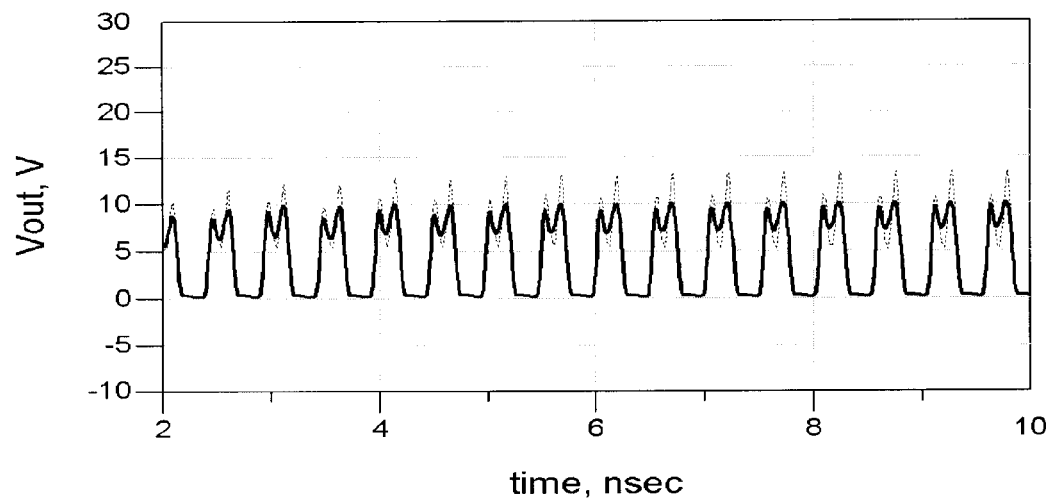
FIG. 10 is a graphical representation of a simulated collector output voltage waveform during RF overdrive when output termination impedance is 50 ohm and the collector output is connected (a) with (solid) and (b) without (dot) voltage overload protection circuit.
Figure 11:
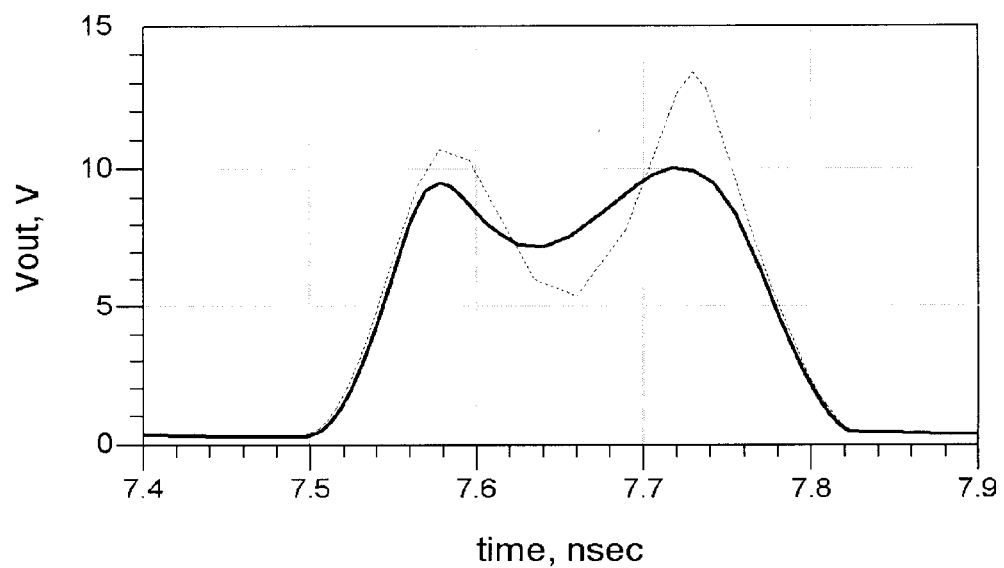
FIG. 11 is a close up view of FIG. 10.

FIG. 10 (solid line) shows the transistor output waveform with the voltage overload protection circuit clamping the excess voltage. During a voltage overload event, such as in a condition of an output impedance mismatch, a RF overdrive and/or a modulated input signal condition, the overload current is coupled across the diode string D2 of the trigger and turns on the switch. The turn on time of the voltage overload protection circuit is very fast, less than 20 psec, as shown in FIG. 11.

To protect the SiGe HBT power amplifiers, the same protection circuit topology as shown in FIGS. 8 and 9 can be implemented. Since SiGe HBT has a lower breakdown than GaAs HBT, the voltage overload protection circuit is very important for improving reliability of SiGe HBT power amplifiers. In addition to GaAs and SiGe power amplifier process technologies, the overload protection circuit topology as shown in FIGS. 8 and 9 can be implemented with power amplifier process technologies of Silicon bipolar, CMOS and the like.

Figure 12:
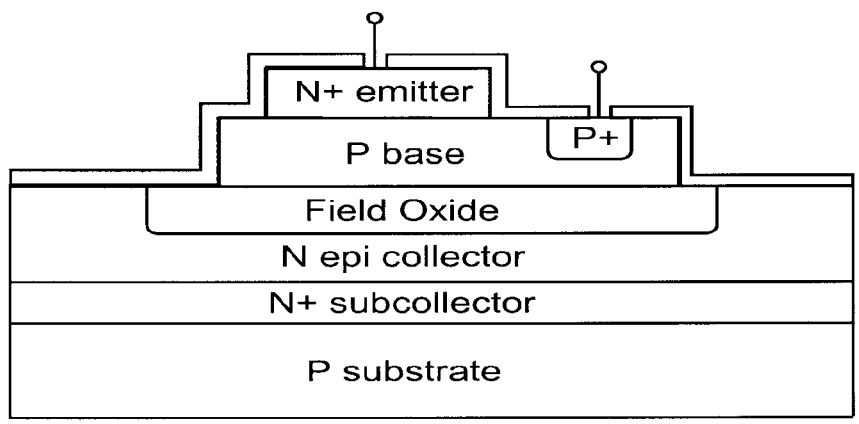
FIG. 12 is cross-sectional view of an isolated implanted diode using base emitter junction for SiGe.

In a preferred embodiment for SiGe, as shown in FIG. 12, the diode is an isolated implanted diode. The isolated implanted diode is constructed advantageously using conventional processes.

The diode string triggered overload protection circuits shown in FIGS. 8 and 9 advantageously work as ESD protection circuits for the RF output pin and the DC pin, where the voltage swing and operation voltage are high. However, as noted above, ESD protection circuits used to protect RF input pins need to meet additional challenges.

Figure 13:
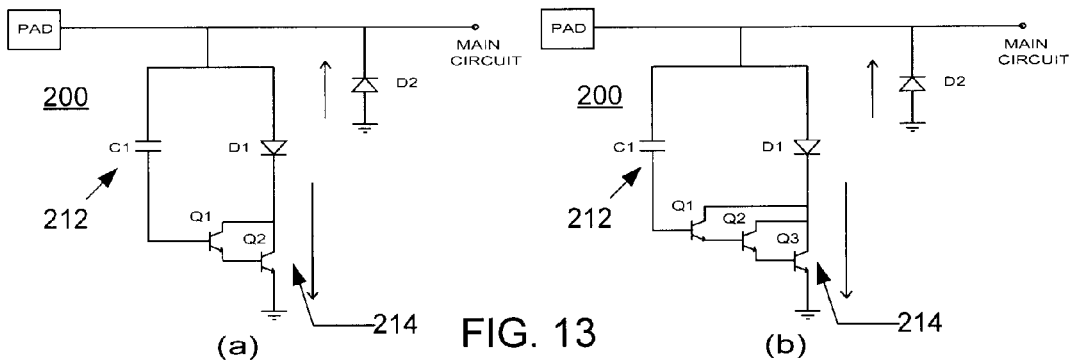
FIG. 13 are schematics of capacitor triggered Darlington switch ESD protection circuits for RF input pin using Darlington switch of (a) two transistors and (b) three transistors.

An ESD protection circuit 200 for a RF input pin is shown in FIG. 13. The circuit 200, which includes a Darlington pair transistor switch 214 comprising a first transistor Q1 in series with a second transistor Q2, is modified by replacing the triggering diode string shown in FIGS. 8 and 9 with a capacitor C1. The capacitor C1 serves as a trigger 212 for the transistor switch 214, which is in series with a single diode D1. During an ESD event, the ESD current is coupled across the capacitor C1 and turns on the Darlington pair 214. Since the Darlington pair 214 has high current gain, only a small amount of input ESD current is needed to trigger the Darlington pair 214, thus resulting in a small size for the trigger capacitor C1 212. The capacitor C1 also has the benefit of blocking the DC current, reducing the leakage current at high power, improving linearly and lowering the overall capacitance loading. Although the circuit does not necessarily have to be connected directly to a pad, since ESD is transmitted from outside of the circuit, usually via a pad, the ESD protection circuit can provide ESD protection at the pad.

Figure 3:
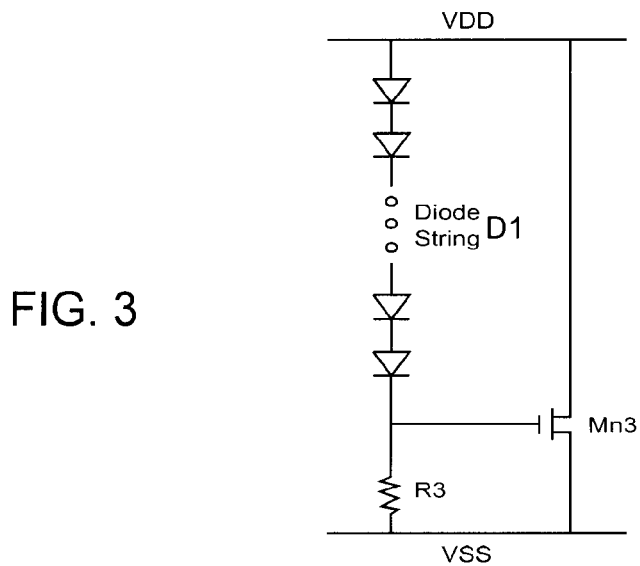
FIG. 3 is a schematic of a VDD to VSS clamp circuit.
Figure 4:
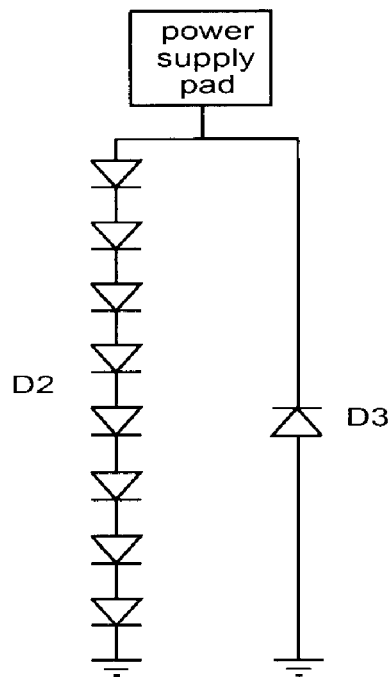
FIG. 4 is a schematic of an on-chip voltage overload protection circuit using all diodes.
Figure 6:
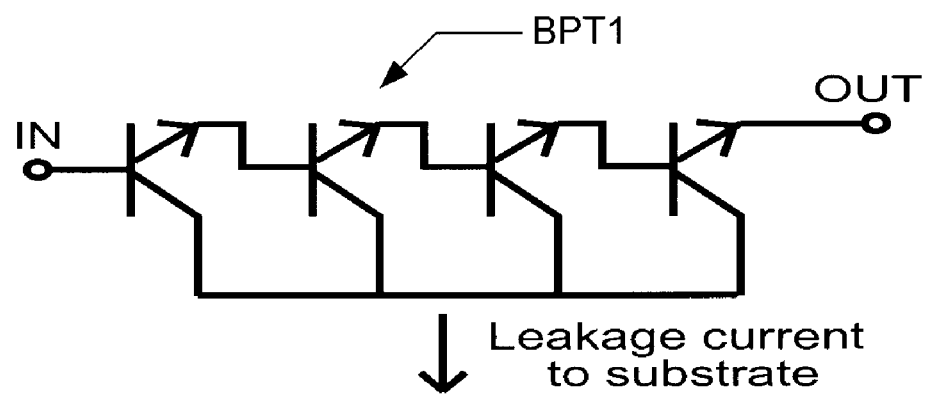
FIG. 6 is a schematic of an implanted diode string without isolation in p-substrate SiGe.
Figure 5:
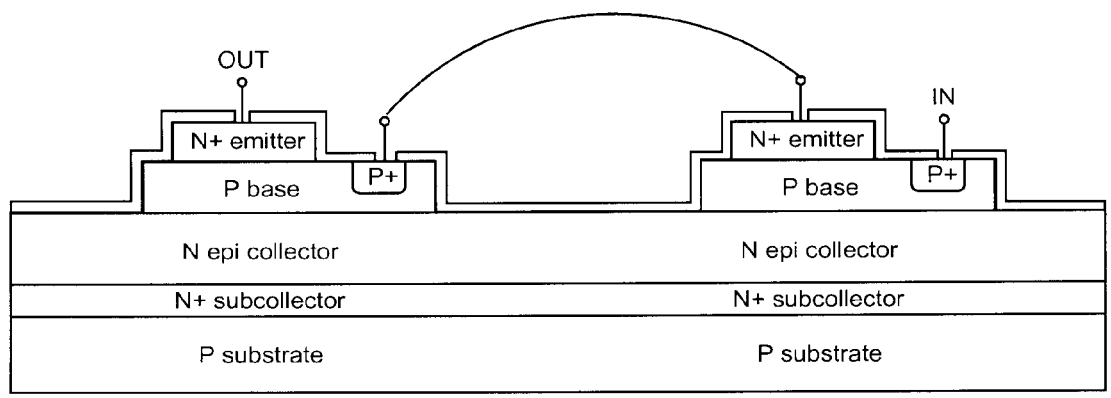
FIG. 5 is a cross-sectional view of a diode string in p-substrate SiGe.
Figure 14:
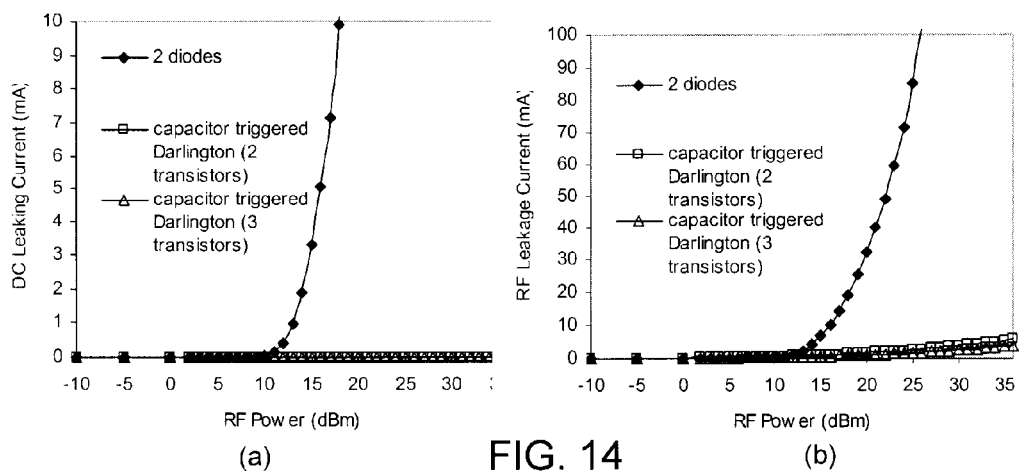
FIG. 14 is a graphical representation showing (a) simulated DC leakage current of ESD protection circuits and (b) simulated RF leakage current of ESD protection circuits.
Figure 15:
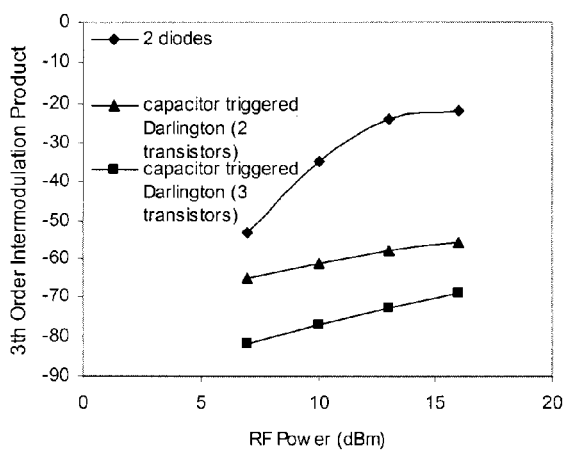
FIG. 15 is a graphical representation showing simulated 2 tone 3rd order intermodulation product of the ESD protection circuits.

For the Darlington switch 214, it preferably comprises either 2 transistors Q1 and Q2 mounted in series, as depicted in FIG. 13a, or 3 transistors mounted in series Q1, Q2 and Q3, as depicted in FIG. 13b. Measurements have shown that the two-transistor Darlington switch offers better ESD protection, but the three-transistor Darlington switch has less capacitance. As confirmed in FIG. 14a and FIG. 14b, the DC and RF leakage current of the capacitor triggered Darlington pair ESD protection circuits are lower than those of a 2-diode ESD protection circuit. Furthermore, the capacitor triggered Darlington pair ESD protection circuits have better linearity as shown in FIG. 15.

The reverse diodes D3 and D2, shown in both FIGS. 8, 9 and 13, respectively, can be used for clamping excess negative voltage.

Figure 16:
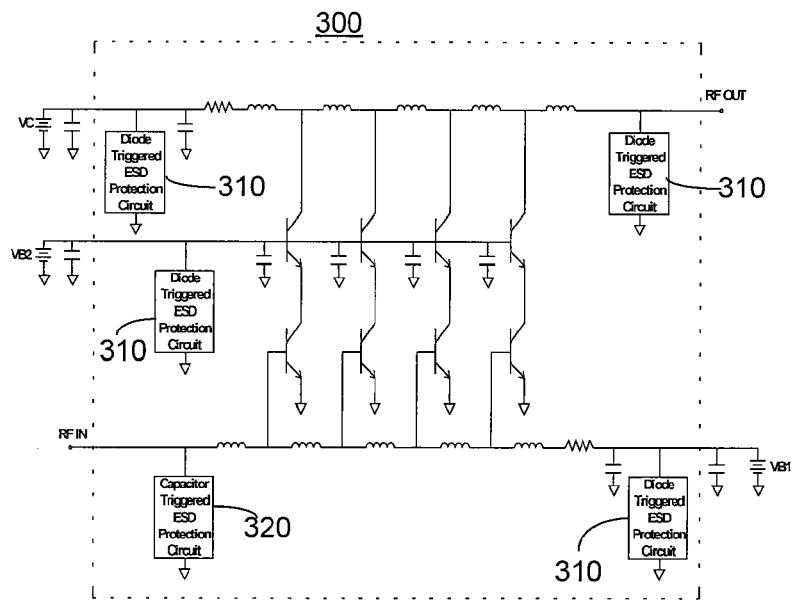
FIG. 16 is a schematic of broadband distributed amplifiers with a single ESD protection circuit at each pin.
Figure 17:
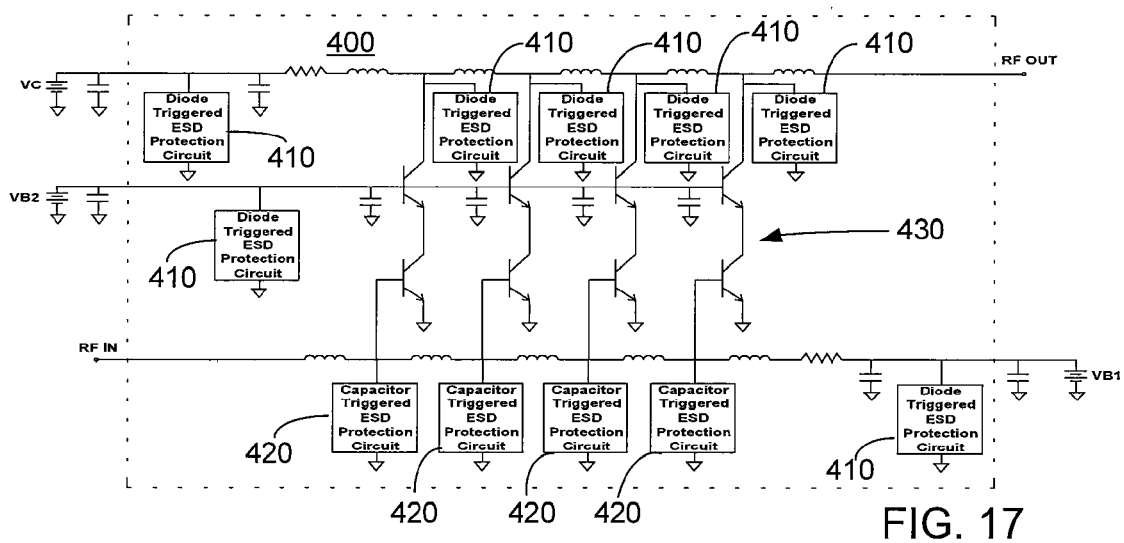
FIG. 17 is a schematic of a broadband distributed amplifier with ESD protection circuits absorbed by the artificial transmission lines.

A distributed amplifier has very wide bandwidth due to its transmission line characteristic. However, when ESD protection circuits 310 are added to a distributed amplifier 300 as shown in FIG. 16, the capacitance loading of the ESD protection circuits 310 can degrade the bandwidth of a distributed amplifier 300. To improve ESD robustness with minimum degradation in bandwidth, ESD protection circuits 410 and 420 can be absorbed inside the artificial transmission lines of the distributed amplifier 400 as shown in FIG. 17. In this scheme, since ESD protection circuits 410 are distributed in every transistor stage 430, the capacitance of the ESD protection circuit 410, 420 is absorbed and becomes part of the capacitance used for forming the artificial transmission lines. With distributed ESD protection, one big ESD protection circuit can advantageously be divided into more than one smaller circuit with the capacitance of each ESD protection circuit absorbed into each stage. Since there are more ESD protection circuits, the size of each, and of each current switch (Darlington pair), can be reduced. Even with the same total capacitance or even larger, the capacitance loading to the distributed amplifier is less since the capacitance loading is absorbed. The distributed ESD scheme can be applied to other non-Darlington ESD protection circuits.

As depicted in FIG. 17, the preferred embodiment of a distributed amplifier 400 with ESD protection comprises a collector voltage pin VC, an RF output pin RF OUT, an RF input pin RF IN, a first base voltage pin VB1, a second base voltage pin VB2, and a plurality of transistor stages 430, The amplifier 400 preferably includes a diode triggered ESD protection circuit 410 at pins VC, VB1 and VB2, and ESD protection circuits distributed at each transistor stage 430. Preferably, a diode triggered ESD protection circuit 410 is distributed at each transistor stage in parallel with the upper transistor stage along the output transmission line and a capacitor triggered ESD protection circuit 420 is distributed at each stage in parallel with the lower transistor stage along the input transmission line.

For the output line, the diode string turns on the Darlington once the ESD voltage exceeds the turn on voltage of the diode string. An alternative ESD protection circuit is needed to meet an additional challenge for the RF input port protection. For the RF input port ESD protection, the base-emitter junction at the RF signal input turns on during the ESD event. That is, the ESD protection circuit only turns on when the base voltage becomes sufficiently high, due to base-emitter resistance drop. Because of this inherent problem, the base-emitter has to endure some amount of ESD stress before the protection circuit turns on. For this reason, ESD voltage protection for the input is more difficult. The input ESD protection circuit needs to limit excessive forward base-emitter current during ESD stress. For this reason, an ESD protection circuit with a Darlington pair triggered by a capacitor is used. During an ESD event, ESD is coupled across the capacitor and turns on the Darlington pair. The capacitor also has the benefit of blocking the DC current, reducing the leakage current at high power, and lowering the overall capacitance loading.

Figure 18:
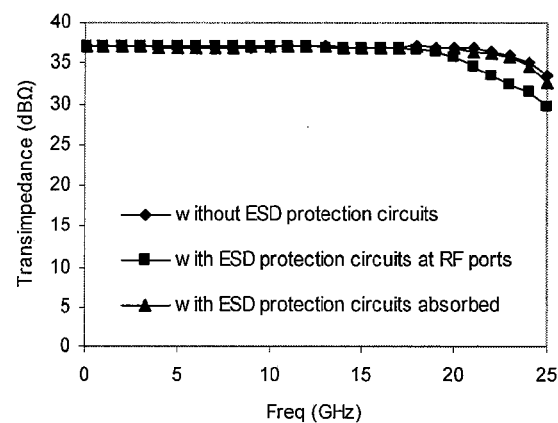
FIG. 18 includes a graphical representation showing a comparison of simulated transimpedance of a distributed amplifier without ESD protection circuits and with ESD protection circuits, either with a single ESD protection circuit at each RF pin or with ESD protection circuits absorbed by the artificial transmission lines.

For a distributed amplifier, the overall bandwidth is determined by the bandwidth of each transistor stage. Since the capacitance loading of all the ESD protection circuits is divided, only a fraction of this capacitance loading would affect the bandwidth. This results in improved bandwidth over the case with only a single large ESD protection circuit at each RF pin. FIG. 18 compares the simulated trans-impedance of a distributed amplifier without ESD protection circuits, with a single ESD protection circuit at each RF pin, and with ESD protection circuits distributed among each stage and its capacitance being absorbed by the artificial transmission lines. As shown in FIG. 18, for the same level of ESD protection, there is significantly less bandwidth degradation when the ESD protection circuits are distributed along the artificial transmission lines.

Turning back to FIGS. 8, 9 and 13 exemplary embodiments of diode triggered and capacitor triggered ESD protection circuits are shown. In FIG. 8 the diode triggered ESD protection circuit includes a positive threshold voltage trigger, which comprises a diode string D2 in series with a single resistor R1 The trigger is used to trigger a bipolar transistor switch Q3 in series with a single diode D5. In FIG. 9 the positive threshold voltage trigger comprises a diode string D2 in series with a single diode D4 and a single resistor R1. The voltage trigger is used to trigger a Darlington pair transistor switch in series with a single diode D5. The Darlington pair transistor switch comprises a first transistor Q2 in series with a second transistor Q4. For the same circuit providing both ESD and voltage overload protection, the number of diodes can be carefully selected.

A capacitor triggered ESD protection circuit is shown in FIG. 13. The circuit, which preferably includes a Darlington pair transistor switch comprising a first transistor Q1 in series with a second transistor Q2, is modified by replacing the triggering diode string shown in FIGS. 8 and 9 with a capacitor C1. The capacitor C1 serves as a trigger for the transistor switch.

In the foregoing specification, the invention has been described with reference to specific embodiments thereof. It will, however, be evident that various modifications and changes may be made thereto without departing from the broader spirit and scope of the invention. For example, each feature of one embodiment can be mixed and matched with other features shown in other embodiments. Features and processes known to those of ordinary skill may similarly be incorporated as desired. Additionally and obviously, features may be added or subtracted as desired. Accordingly, the invention is not to be restricted except in light of the attached claims and their equivalents.

What is claimed is:

1. An RF circuit with overload protection comprising
a distributed RF amplifier including a plurality of RF amplifier stages, wherein each RF amplifier stage has an RF output connected to a distributed node along a RF output transmission line;
a plurality of overload protection circuits connected at each of the distributed nodes along the RF output transmission line, wherein each overload protection circuit includes:
a positive voltage threshold trigger;
a switch comprising either a Darlington transistor or a bipolar transistor coupled to the positive voltage threshold trigger; and
a diode coupled in series with the collector of the Darlington transistor or bipolar transistor in the switch.

2. The RF circuit of claim 1, wherein the positive voltage threshold trigger comprises a diode string including a plurality of diodes.

3. The RF circuit of claim 2, wherein the positive voltage threshold trigger comprises a resistor coupled in series with the diode string.

4. The RF circuit of claim 3, wherein the positive voltage threshold trigger comprises a diode in series with the resistor and the diode string.

5. The circuit of claim 1, wherein the switch comprises a Darlington transistor and wherein the switch includes first and second transistors.

6. The RF circuit of claim 2, wherein the RF output of at least one of the RF amplifier stages is connected between the diode and the diode string of one of the overload protection circuits.

7. An RF circuit comprising
a distributed amplifier including a plurality of RF amplifier stages, wherein each RF amplifier stage has an RF output connected to a distributed node along a RF output transmission line;
a plurality of overload protection circuits connected at more than one of the distributed nodes along the RF output transmission line, wherein each overload protection circuit includes:
a positive voltage threshold trigger coupled to either a bipolar or a Darlington transistor switch, wherein a diode is coupled in series with the collector of the bipolar or Darlington transistor switch; and
a reverse diode coupled in parallel with the positive voltage threshold trigger and switch.

8. The RF circuit of claim 7, wherein the positive voltage threshold trigger comprises a diode string including a plurality of diodes.

9. The RF circuit of claim 8, wherein the positive voltage threshold trigger comprises a resistor coupled in series with the diode string.

10. The RF circuit of claim 9, wherein the positive voltage threshold trigger comprises a diode coupled in series with the resistor and the diode string.

11. The RF circuit of claim 7, wherein the positive voltage threshold trigger is coupled to a Darlington transistor switch comprising first and second transistors.

12. The RF circuit of claim 7, wherein the RF output of at least one of the RF amplifiers is connected between the diode and the positive voltage threshold trigger of one of the overload protection circuits.

13. A method of protecting an RF power amplifier for connection to a load during a voltage overload event, the RF power amplifier being a distributed RF amplifier comprising a plurality of RF amplifier stages, wherein each RF amplifier stage has an RF output connected to a distributed node along a RF output transmission line, the method comprising:
coupling an overload current on an RF transmission line to a plurality of overload protection circuits connected at more than one of the distributed nodes along the RF output transmission line;
for each overload protection circuit:
coupling at least a portion of the overload current across a positive voltage threshold trigger of the overload protection circuit;
turning on a switch coupled to the positive voltage threshold trigger, wherein the switch includes either a bipolar transistor or a Darlington transistor; and
sinking the overload current through the switch and a diode coupled in series with the collector of the bipolar or Darlington transistor of the switch.

14. The method of claim 13, wherein the positive voltage threshold trigger comprises a resistor coupled in series with a diode string.

15. The method of claim 14, wherein the positive voltage threshold trigger comprises a diode in coupled series with the resistor and a diode string.

16. The method of claim 13, wherein the switch comprises a Darlington transistor and wherein the switch includes first and second transistors.

17. The method of claim 13, wherein an output of the RF power amplifier is connected between the diode and the positive voltage trigger of at least one of the overload protection circuits.

18. The RF circuit of claim 1, wherein at least one of the overload protection circuits comprises a diode in coupled series with a resistor, wherein the switch comprises a Darlington transistor, wherein the series combination of the diode and resistor is connected between the base and emitter of the Darlington transistor.

* * * * *

UNITED STATES PATENT AND TRADEMARK OFFICE
CERTIFICATE OF CORRECTION

| | | |
|---|---|---|
| PATENT NO. | : 7,859,803 B2 | Page 1 of 1 |
| APPLICATION NO. | : 11/533328 | |
| DATED | : December 28, 2010 | |
| INVENTOR(S) | : Ma et al. | |

It is certified that error appears in the above-identified patent and that said Letters Patent is hereby corrected as shown below:

Title Page 2, item (56), under "Other Publications", in Column 2, Line 9, delete ""In GaP/GaAs" and insert -- "InGaP/GaAs --.

Title Page 2, item (56), under "Other Publications", in Column 2, Line 12, delete ""In GaP/GaAs" and insert -- "InGaP/GaAs --.

Column 9, line 6, in Claim 1, delete "comprising" and insert -- comprising: --.

Column 9, line 30, in Claim 5, delete "circuit" and insert -- RF circuit --.

Column 9, line 37, in Claim 7, delete "comprising" and insert -- comprising: --.

Signed and Sealed this
Twenty-fourth Day of May, 2011

David J. Kappos
*Director of the United States Patent and Trademark Office*